United States Patent [19]

Bazes

[11] Patent Number: 4,958,133
[45] Date of Patent: Sep. 18, 1990

[54] CMOS COMPLEMENTARY SELF-BIASED DIFFERENTIAL AMPLIFIER WITH RAIL-TO-RAIL COMMON-MODE INPUT-VOLTAGE RANGE

[75] Inventor: Mel Bazes, Haifa, Israel

[73] Assignee: Intel Corporation, Santa Clara, Calif.

[21] Appl. No.: 434,339

[22] Filed: Nov. 13, 1989

[51] Int. Cl.$^5$ .............................................. H03F 3/45
[52] U.S. Cl. .................................... 330/253; 330/255; 330/258; 330/259; 330/260; 330/311
[58] Field of Search ............... 330/252, 253, 255, 258, 330/259, 260, 311

[56] References Cited

PUBLICATIONS

Fisher, "A Highly Linear CMOS Buffer Amplifiers", IEEE Journal of Solid-State Circuits, vol., SC-22, No. 3, Jun. 1987, pp. 330-334.

Primary Examiner—James B. Mullins
Attorney, Agent, or Firm—Blakely, Sokoloff, Taylor & Zafman

[57] ABSTRACT

A CMOS complementary, self-biased, differential amplifier provides for a rail-to-rail common-mode input-voltage range of operation. A self-biasing scheme is used to provide negative feedback to the amplifier in order to assist in providing a common-mode rejection but providing high gain amplification for differential-mode amplification.

8 Claims, 2 Drawing Sheets

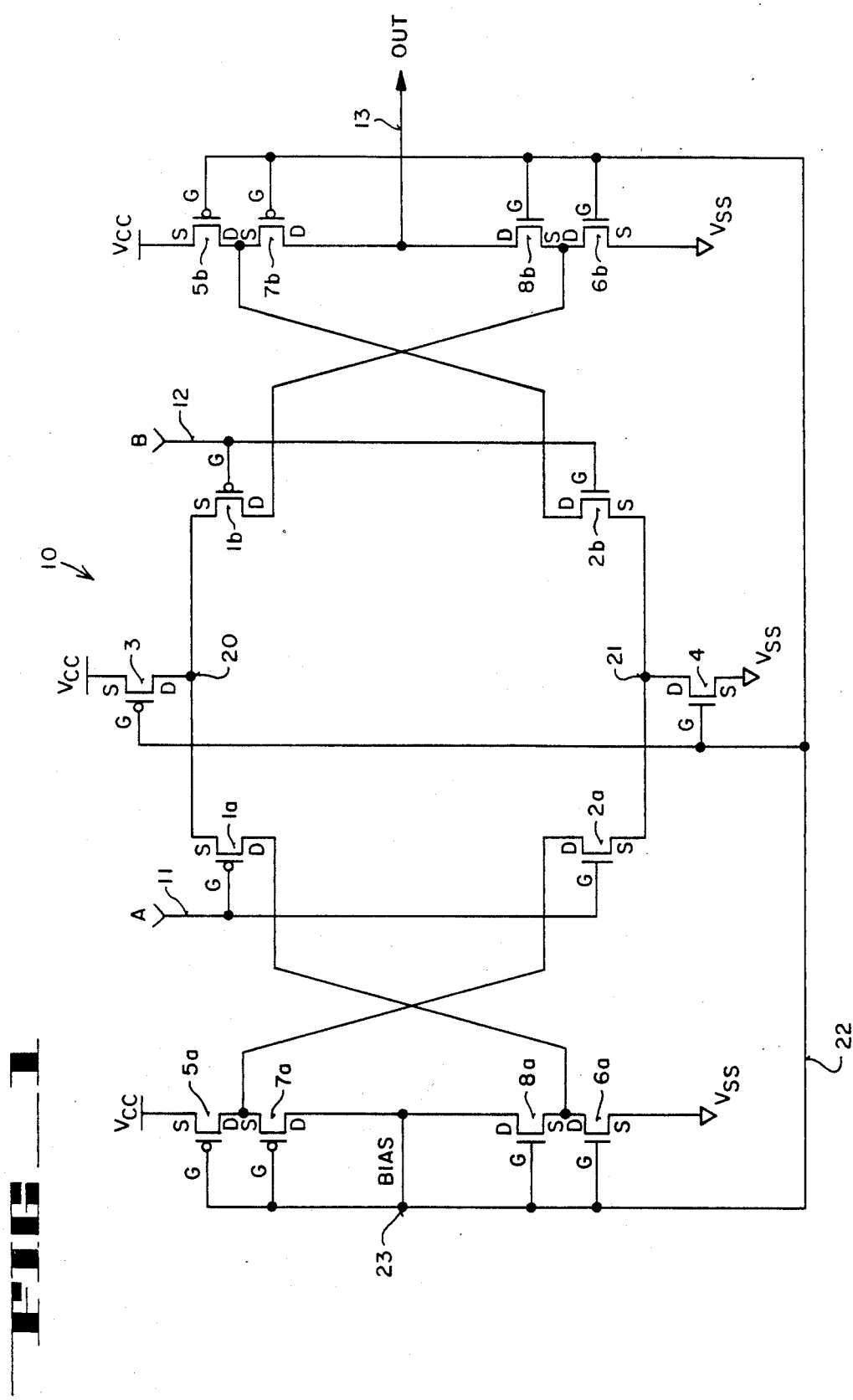

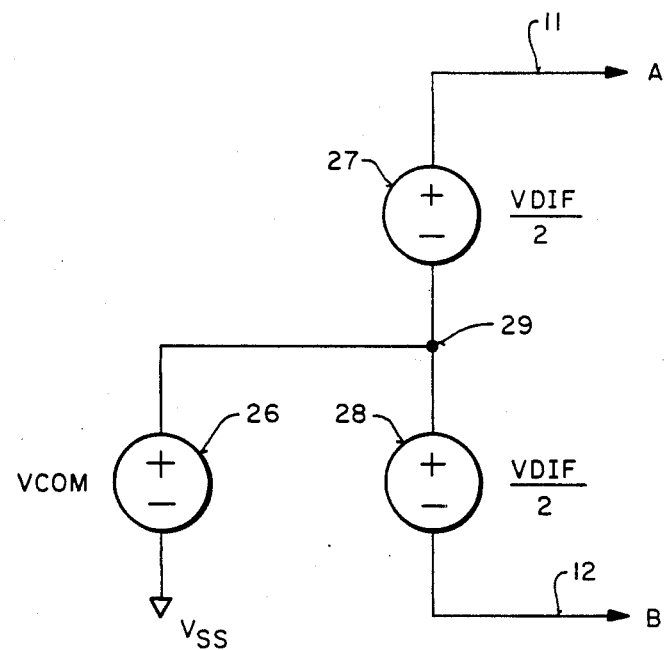
FIG_2

CMOS COMPLEMENTARY SELF-BIASED DIFFERENTIAL AMPLIFIER WITH RAIL-TO-RAIL COMMON-MODE INPUT-VOLTAGE RANGE

BACKGROUND OF THE INVENTION

1. Field of the Invention

The present invention relates to the field of MOS integrated amplifiers and more specifically to CMOS differential amplifiers.

2. Related Application

This application is related to a co-pending application, Ser. No. 207,668, filed June 16, 1988, and entitled "Self-Biased, High-Gain Differential Amplifier".

3. Prior Art

In the design of complementary metal-oxide semiconductor (CMOS) integrated circuits, differential amplifiers are used for various applications because a number of advantages can be derived from these types of amplifiers, as compared to single-ended amplifiers. Differential amplifiers are used to amplify analog, as well as digital signals, and can be used in various implementations to provide an output from the amplifier in response to differential inputs. For example, a general-purpose differential amplifier amplifies the difference of the two input signals. But these differential amplifiers can be readily adapted to function as an operational amplifier, a comparator, a sense amplifier and as a front-end buffer stage for another circuit. Differential amplifiers are utilized where linear amplification having a minimum of distortion is desired.

However, a typical differential amplifier will operate only over a relatively narrow range of common-mode input voltages. As the amplifier is forced to extend beyond this small range of common-mode voltages, the differential-mode gain drops off sharply and in some instances drops to zero.

One technique for improving the range of this common-mode input voltage range is described in "A Highly Linear CMOS Buffer Amplifier"; Fisher, John A.; IEEE Journal of Solid-State Circuits, Vol. sc-22, No. 3; pp. 330-334; June 1987. Although this paper describes improvements in linearity and drive capability over previous wide-input-range amplifiers, the biasing scheme it uses is uncompensated for variations in common-mode voltage, supply voltage, temperature, and process. Because of the lack of compensation, the practical common-mode range of the differential inputs is somewhat less than the full rail-to-rail range. Further, it relies on the use of saturated current sources for biasing the circuitry, and such biasing techniques can result in reduced common-mode range and amplifier bandwidth.

It is appreciated then that what is needed is a differential amplifier for amplifying differential input voltages in which the common-mode component can vary over an extremely wide range of voltages. Further, it is most desirable for that wide range of voltages to extend as far as the rail-to-rail voltage, while maintaining the differential-mode gain of the amplifier at a high level.

SUMMARY OF THE INVENTION

The present invention provides for a CMOS complementary self-biased differential amplifier having a rail-to-rail common-mode input-voltage range. The differential amplifier of the present invention has a very wide common-mode input voltage range, so that the input common-mode voltage range covers the entire range from a positive supply rail to a negative supply rail. Because of the self-biasing scheme, the bias point has low sensitivity to temperature, processing variations, supply-voltage variations and common-mode input voltages.

The amplifier is comprised of complementary pairs of transistors which are symmetrically configured, and wherein corresponding symmetrical transistors are matched to have the same characteristics. Because of the biasing scheme, negative feedback is provided internally within the amplifier to provide the low sensitivity to variations. A strong common-mode rejection is provided because of the self-biasing scheme, in order to provide an extended range of common-mode input voltages, but at the same time providing a high gain in differential-mode amplification.

BRIEF DESCRIPTION OF THE DRAWINGS

FIG. 1 is a circuit schematic diagram of a differential amplifier of the preferred embodiment.

FIG. 2 is a circuit equivalent schematic diagram showing a common-mode and differential-mode voltages.

DETAILED DESCRIPTION OF THE PRESENT INVENTION

A CMOS complementary self-biased differential amplifier with a wide common-mode input-voltage range is described. In the following description, numerous specific details are set forth, such as specific circuit components, signals, etc., to provide a thorough understanding of the present invention. It will be obvious, however, to one skilled in the art that the present invention may be practiced without these specific details. In other instances, processing steps, control lines, and well-known structures have not been set forth in detail in order not to obscure the present invention in unnecessary detail.

Referring to FIG. 1, a differential amplifier circuit 10 of the preferred embodiment is shown. The purpose of differential amplifier 10 is to amplify differential input voltages VA and VB of inputs A and B, respectively, whose common-mode component can vary over an extremely wide range of voltages. The extended range for the common-mode voltages is to the two rails, shown to be Vcc and Vss in FIG. 1, wherein the differential-mode gain of the amplifier still remains sufficiently high for the amplifier to be functional over this range of voltages.

Amplifier 10 is coupled to receive two differential inputs A and B, as voltages VA and VB, on lines 11 and 12, respectively, and to provide a single-ended output VOUT on line 13. Amplifier 10 is completely complementary and is substantially symmetrical about nodes 20 and 21. Transistors 1a-2a and 5a-8a reside to the left of nodes 20 and 21 in FIG. 1 and are applicable to the amplification of input signal A. Transistors 1b-2b and 5b-6b reside to the right of nodes 20 and 21 in the drawing of FIG. 1 and are applicable in the amplification of input signal B. Transistors 3 and 4 are at the center of the symmetry and are applicable to both sides of the circuit.

Transistor 3 is a p-type device coupled between node 20 and a supply voltage (positive rail voltage), which in this instance is Vcc. Transistor 4 is a n-type device coupled between node 21 and a supply return Vss (negative rail voltage), which in this instance is ground. The gates of transistors 3 and 4 are coupled together, and these two transistors 3 and 4 operate as a complementary pair. Transistors 5a–8a are coupled in series between Vcc and Vss. Transistor 5a is a p-type device having its source coupled to Vcc and its drain coupled to the source of transistor 7a. Transistor 7a is also a p-type device having its drain coupled to the drain of transistor 8a. Transistor 8a is a n-type device and has its source coupled to the drain of transistor 6 a. Transistor 6a is also a n-type device and has its source coupled to Vss. The gates of transistors 5a–8a are coupled together on line 22, wherein line 22 is also coupled to the gates of transistors 3 and 4.

Transistors 5a and 6a form the first complementary transistor pair in the series leg, while transistors 7a and 8a form the other complementary transistor pair of this series leg. Conversely transistors 5b–6b are also coupled in series between Vcc and Vss equivalently to transistors 5a–8a. Transistors 5b and 6b operate as the first complementary transistor pair and transistors 7 b and 8b operate as the other complementary transistor pair in the right series leg. The gates of transistors 5b–8b are coupled together to line 22.

Transistor 1a is a p-type device having its source coupled to node 20 and its drain coupled to the drain-source junction of transistors 6a and 8a. Transistor 2a is a n-type device having its source coupled to node 21 and its drain coupled to the drain-source junction of transistors 5a and 7a. The gates of transistors 1a and 2a are coupled together to line 11 for accepting input A. Transistors 1a and 2a operate as a complementary pair.

Transistor 1b is a p-type device having its source coupled to node 20 and its drain coupled to the drain-source junction of transistors 6b and 8b. Transistor 2b is a n-type device having its source coupled to node 21 and its drain coupled to the drain-source junction of transistors 5b and 7b. The gates of transistors 1b and 2b are coupled together to line 12 for accepting input B. Transistors 1b and 2b operate as a complementary transistor pair.

It is to be noted that amplifier 10 is completely complementary since each transistor device has a complementary counter part of the opposite conduction type. Further, amplifier 10 is symmetrical except for the "short-circuit" of drains 7a and 8a to line 22. This "short-circuit" is denoted as BIAS in FIG. 1, and the voltage at this point is referred to as VBIAS. At the right (B-input side) side of the circuit, drains of transistors 7b and 8b are not coupled to line 22. Instead these drains are coupled to output line 13, wherein an output from amplifier 10 is taken from line 13 as VOUT.

It is to be further noted that all of the transistors of amplifier 10, except for transistors 3 and 4, are comprised of matched device pairs. The matched pairs are denoted by having the same reference numeral and differentiated by the suffix a or b. For example, transistors 1a and 1b comprise one of the matched pairs.

Each of the transistor pairs 1a and 8a, 1b and 8 b, 2a and 7a, and 2b and 7b, comprises a "folded-cascode" pair. Each of these transistor pairs comprises a cascode pair since the drain of the first device in the pair is cascaded with the source of the second device in the pair in classic cascode fashion. Each of these pairs is "folded" since the two devices in each pair are of opposite conduction type. Therefore, the small-signal current output from the drain of the first device in the pair "folds around" in direction when it enters the source of the second device in the pair.

The BIAS node 23 provides the bias voltage VBIAS for the amplifier 10. The bias is generated by the negative feedback from the drains of transistors 7a and 8a to the gates of transistors 5a–8a, 5b–8b, 3 and 4. This negative feedback causes the bias voltage to be stable and insensitive to variations in processing, supply voltage, temperature, and common-mode input voltage. Because the bias for amplifier 10 is generated internally to the amplifier itself, the amplifier provides a self-bias (no external biasing scheme is used).

Accordingly, any variation in operating conditions, processing or in common-mode input voltage which causes the bias voltage VBIAS at node 23 to rise, would also cause the voltage on the gates of transistors 5a–8a to also increase. Transistors 5a–8a would then conduct in the direction that causes the biasing voltage at node 23 to decrease. Furthermore, transistors 3–4 and 5b–8b would also conduct in the direction that lowers the biasing voltage on node 23, but to a lesser extent. Therefore, because of the negative feedback provided by the biasing voltage at node 23, variations in operating conditions, in processing or in common-mode input-voltage would be compensated by the negative feedback scheme.

The negative feedback in the self-biasing scheme also contributes to a rejection (or attenuation) of common-mode input components. It is because of this common-mode rejection that amplifier 10 is capable of operating over a wide range of common-mode input voltages than the prior art differential amplifiers. An example illustration in the next paragraph describes how the amplifier can obtain a wide range of common-mode input voltages.

Hypothetically, if input lines 11 and 12 are shorted together and are coupled to a voltage source that generates a voltage VCOM in this instance, the differential input voltage is zero volts, while the common-mode voltage is VCOM. Because all match-paired transistors in the amplifier 10 are assumed to be perfectly matched, and since the gates of all device pairs receive the same voltages, the output voltage on line 13 must necessarily be identical to the voltage on node 23.

Assume now that VCOM begins to change. The bias voltage on node 23 will also change in reaction to the change in VCOM. For example, if VCOM rises, then VBIAS would fall. However, the negative feedback that is inherent in the self-biasing scheme attenuates the change in VBIAS. With proper design, VBIAS would hardly vary at all even if VCOM varies from rail to rail. As noted above, VOUT must necessarily be equal to VBIAS, so VOUT also would hardly vary, even if VCOM varies from rail to rail. Thus, the self-bias of the amplifier serves to actively reject the common-mode input components.

Conversely, differential-mode input voltages are strongly amplified. Again, speaking hypothetically, if a differential input voltage VDIF is coupled across input lines 11 and 12, an equivalent circuit, which is shown in FIG. 2, is derived. In the equivalent circuit of FIG. 2, voltage source 26 is coupled between node 29 and Vss, representing the common-mode voltage VCOM. Voltage source 27 coupled between node 29 and input line 11 and voltage source 28 coupled between node 29 and input line 12 represent the differential input voltage values. Each voltage source 27 and 28 has the value VDIF/2. The voltage on line 11 is given by $$VCOM + VDIF/2,$$

while the voltage on input line 12 is given by

VCOM−VDIF/2.

Therefore, the voltage on input line 12 is lower by a value of (VCOM+VDIF/2)−(VCOM−VDIF/2)

which equals VDIF, if VOUT is to be identical to VBIAS.

If VDIF is positive, then transistor 1b will conduct more than transistor 1a, thereby raising the source voltage of transistor 8b with respect to transistor 8a and causing VOUT to rise above VBIAS. Likewise, transistor 2 b will conduct less than transistor 2a, thereby raising the source voltage of transistor 7b with respect to transistor 7a and also causing VOUT to rise above VBIAS. Thus, a positive differential voltage VDIF causes VOUT to rise above VBIAS through two paths. Equivalently, a negative VDIF causes VOUT to fall below VBIAS through two paths.

The two pairs of input transistors 1a–b and 2a–b conduct over different portions over the common-mode range. Transistors 1a–b conduct for common-mode input voltages that range from Vss up to approximately Vcc−|VT1|−0.5v, where VT1 is the threshold voltage of transistors 1a–b. Transistors 2a–b conduct for common-mode input voltages that range from approximately Vss+|VT2|+0.5v up to Vcc, where VT2 is the threshold voltage of transistors 2a–b. Thus, three regions of operation can be defined for the input devices as follows:

Region 1: Vss to Vss+|VT2|+0.5v,
where transistors 1a–b conduct, while transistors 2a –b are cut off.
Region 2: Vss+|VT2|+0.5v to Vcc−|VT1|−0.5v,
where both transistor pairs 1a–b and 2a–b conduct.
Region 3: Vcc−|VT1|−0.5v to Vcc,
where transistors 2a–b conduct, while transistors 1a–b are cut off.

Therefore, one or both of the input pairs conduct over the entire common-mode range of input voltages from Vss to Vcc. The differential-mode gain of the amplifier varies, therefore, according to the common-mode voltage at the input. The differential-mode gain in regions 1 and 3 is approximately half the differential-mode gain in region 2. However, the differential-mode gain is not zero and is still sufficient to provide amplification gain.

SMALL-GAIN EQUATIONS

In order to understand fully the workings of amplifier 10, small signal gain equations are provided below. Equations pertaining to differential-mode gain are presented first followed by equations pertaining to the common-mode gain.

Differential-Mode Gain

The differential-mode gain is defined as $$Ad = \frac{vout}{va - vb},\qquad \text{(Equation 1)}$$

where vout is the small-signal variation of the output voltage VOUT, va is the small-signal variation of VA, and vb is the small-signal variation of VB.

A small-signal analysis of the amplifier shows that Ad is given approximately by $$Ad \simeq \frac{gm1' + gm2'}{gd7 + gd8},\qquad \text{(Equation 2)}$$

where gm1' is the degraded transconductance of transistors 1 a–b, gm2' is the degraded transconductance of transistors 2a–b, gd7 is the drain conductance of transistors 7a–b, and gd8 is the drain conductance of transistors 8a–b. The form of Equation 2 is the same as that for an ordinary differential amplifier, except that two transconductances contribute to the gain instead of only one.

The value of the degraded transconductance gm1' is given approximately by $$gm1' \simeq gm1 \frac{1 + \frac{3gd3}{4gm1}}{1 + \frac{gd3}{2gm1}\; 1 + \frac{gd1 + gd6}{gm8}},\qquad \text{(Equation 3)}$$

where gm1 and gm8 are the transconductances of transistors 1a –b, and 8a–b, respectively, and gd1, gd3, and gd6 are the drain conductances of transistors 1a–b, 3a–b, and 6a–b, respectively. Since gd1+gd6<<gm8, and since gd3 is of the same order of magnitude as gm1, to a good approximation gm1' is equal to gm1.

The value of the degraded transconductance gm2' is given approximately by $$gm2' \simeq gm2 \frac{1 + \frac{3gd4}{4gm2}}{\left(1 + \frac{gd4}{2gm2}\right)\left(1 + \frac{gd2 + gd5}{gm7}\right)},\qquad \text{(Equation 4)}$$

where gm2 and gm7 are the transconductances of transistors 2a –b and 7a–b, respectively, and gd2, gd4, and gd5 are the drain conductances of transistors 2a–b, 4a–b, and 5a–b, respectively. As in the case of gm1', gm2' is approximately equal to gm2.

From Equation 2, it is seen that in Regions 1 and 3 of common-mode input-voltages, either gm1' or gm2' is 0, since either input transistors 1a–b or 2a–b is turned off. Therefore, Ad in Regions 1 and 3 is approximately half the value of Ad in Region 2, where both pairs of devices conduct.

Common-Mode Gain

The common-mode gain is defined as $$Ac = (\tfrac{1}{2})\frac{vout}{va + vb}.\qquad \text{(Equation 5)}$$

In general, Ac should be as small as possible for best amplifier operation.

The small-signal common-mode gain Ac is given approximately by $$Ac \simeq \left(\frac{-1}{4}\right)\frac{gd3' + gd4'}{gm3' + gm4' + 2gm5' + 2gm6'}, \quad \text{(Equation 6)}$$

where gd3' and gd4' are the degraded drain conductances of transistors 3 and 4, respectively, and gm3', gm4', gm5', and gm6' are the degraded transconductances of transistors 3, 4, 5a–b, and 6a–b, respectively. It is seen from the denominator of Equation 6 that the common-mode gain is actively reduced by the transconductances of transistors 3, 4, 5a–b and 6a–b. This active common-mode rejection does not exist in ordinary differential amplifiers.

The degraded drain conductance gd3' is given approximately by $$gd3' \simeq \frac{gd3}{\left(1 + \frac{gd3}{2gm1}\right)\left(1 + \frac{gd1 + gd6}{gm8}\right)}. \quad \text{(Equation 7)}$$

To a good approximation, gd3' equals gd3.

The degraded drain conductance gd4' is given approximately by $$gd4' \simeq \frac{gd4}{\left(1 + \frac{gd4}{2gm2}\right)\left(1 + \frac{gd2 + gd5}{gm7}\right)}. \quad \text{(Equation 8)}$$

To a good approximation, gd4' equals gd4.

The degraded transconductance gm3' is given approximately by $$gm3' \simeq \frac{gm3}{\left(1 + \frac{gd3}{2gm1}\right)\left(1 + \frac{gd1 + gd6}{gm8}\right)}. \quad \text{(Equation 9)}$$

To a good approximation, gm3' equals gm3.

The degraded transconductance gm4' is given approximately by $$gm4' \simeq \frac{gm4}{\left(1 + \frac{gd4}{2gm2}\right)\left(1 + \frac{gd2 + gd5}{gm7}\right)}. \quad \text{(Equation 10)}$$

To a good approximation, gm4' equals gm4.

The degraded transconductance gm6' is given approximately by $$gm6' \simeq gm6 \frac{1 + \frac{gd1 + gd6}{gm6}}{1 + \frac{gd1 + gd6}{gm8}}. \quad \text{(Equation 11)}$$

To a good approximation, gm6' equals gm6.

The degraded transconductance gm5' is given approximately by $$gm5' \simeq gm5 \frac{1 + \frac{gd2 + gd5}{gm5}}{1 + \frac{gd2 + gd5}{gm7}}. \quad \text{(Equation 12)}$$

To a good approximation, gm5' equals gm5.

Thus, a CMOS complementary self-biased differential amplifier having a rail-to-rail, common-mode input range is described. The input common-mode voltage range covers the entire range from positive supply rail to the negative supply rail (rail-to-rail) capability, which in FIG. 1 allows amplifier 10 to have a range from Vcc to Vss. The output voltage swing is relatively large and therefore amplifier 10 can directly drive single-ended amplification stages with little sensitivity to the bias point of the amplification stages. Further advantages of amplifier 10 is in the bias point of the amplifier. The bias point can be set easily over a wide range of values, has low sensitivity to temperature, processing variations, supply-voltage variations and common-mode input-voltage. Also, the amplifier 10 has wide bandwidth, both for differential mode and amplification and for common-mode rejection.

I claim:

1. A differential amplifier having an improved common-mode input-voltage range for providing common-mode rejection while providing differential-mode amplification through said extended range, comprising:

a first, second, third, and fourth transistors coupled in series between a first voltage and a second voltage and having their gates coupled together to a junction of said second and third transistors which junction forming a bias node;

a fifth, sixth, seventh, and eighth transistors also coupled in series said first voltage and said second voltage, and also having their gates coupled together to the gates of said first, second, third, and fourth transistors;

a ninth transistor coupled between said first voltage and a first node;

a tenth transistor coupled between a second node and said second voltage;

said ninth and tenth transistors having their gates coupled together to the gates of said first, second, third, and fourth transistors;

an eleventh transistor coupled between said first node and the junction of said third and fourth transistors;

a twelfth transistor coupled between said second node and the junction of said first and second transistors;

said eleventh and twelfth transistors having their gates coupled together to receive a first differential input signal;

a thirteenth transistor coupled between said first node and a junction of said seventh and eighth transistors;

a fourteenth transistor coupled between said second node and a junction of said fifth and sixth transistors;

said thirteenth and fourteenth transistors having their gates coupled together to receive a second differential input signal;

said biasing node providing a negative feedback in order to compensate for circuit variations;

said biasing node also providing for common-mode rejection, but providing differential-mode amplification.

2. The differential amplifier of claim 1, wherein said first, second, third and fourth transistors are matched to said fifth, sixth, seventh and eighth transistors, respectively; and said eleventh transistor is matched to said thirteenth transistor and said twelfth transistor is matched to said fourteenth transistor.

3. The differential amplifier of claim 2, wherein said first and fourth transistors are complementary transistor pairs, said second and third transistors are complementary pairs, said fifth and eighth transistors are complementary pairs, said sixth and seventh transistors are complementary pairs, said eleventh and twelfth transistors are complementary pairs, said thirteenth and fourteenth transistors are complementary pairs and said ninth and tenth transistors are complementary pairs.

4. The differential amplifier of claim 3, wherein said second voltage is a ground having zero volts.

5. A complementary metal-oxide semiconductor (CMOS) complementary, self-biased, differential amplifier for providing rail-to-rail common-mode input-voltage range comprising;

a first transistor having its source coupled to a positive supply rail;
   a second transistor having its source coupled to the drain of said first transistor and having its drain coupled to a biasing node;
   a third transistor having its drain coupled to said biasing node;
   a fourth transistor having its drain coupled to the source of said third transistor and its source coupled to a negative supply rail;
   said first, second, third and fourth transistors having their gates coupled to said biasing node;
   a fifth transistor having its source coupled to said positive supply rail;
   a sixth transistor having its source coupled to the drain of said fifth transistor and its drain coupled to an output node;
   a seventh transistor having its drain coupled to said output node;
   an eighth transistor having its drain coupled to the source of said seventh transistor and its source coupled to said negative supply rail;
   said fifth, sixth, seventh and eighth transistors having their gates coupled to said biasing node;
   a ninth transistor having is source coupled to said positive supply rail and its drain coupled to a first node;
   a tenth transistor having its drain coupled to a second node and its source coupled to said negative supply rail;
   said ninth and tenth transistors also having their gates coupled to said biasing node;
   an eleventh transistor having it source coupled to said first node and its drain coupled to the junction of said third and fourth transistors;
   a twelfth transistor having its source coupled to said second node and its drain coupled to the junction of said first and second transistors;
   said eleventh and twelfth transistors having their gates coupled to receive a first differential input signal;
   a thirteenth transistor having its source coupled to said first node and its drain coupled to the junction of said seventh and eighth transistors;
   a fourteenth transistor having its source coupled to said second node and its drain coupled to the junction of said fifth and sixth transistors;
   said thirteenth and fourteenth transistors having their gates coupled to receive a second differential input signal;
   said first, second, fifth, sixth, ninth, eleventh and thirteenth transistors being of p-type devices;
   said third, fourth, seventh, eighth, tenth, twelfth and fourteenth transistors being of n-type devices;
   wherein a negative feedback from said biasing node provides for low sensitivity to temperature, process, supply-voltage, common-mode input-voltage variations and further provides for improved common-mode rejection while providing differential-mode amplification.

6. The differential amplifier of claim 5, wherein said first, second, third and fourth transistors are matched to said fifth, sixth, seventh and eighth transistors, respectively; and
   said eleventh transistor is matched to said thirteenth transistor and said twelfth transistor is matched to said fourteenth transistor.

7. The differential amplifier of claim 6, wherein said first and fourth transistors are complementary transistor pairs, said second and third transistors are complementary pairs, said fifth and eighth transistors are complementary pairs, said sixth and seventh transistors are complementary pairs, said eleventh and twelfth transistors are complementary pairs, said thirteenth and fourteenth transistors are complementary pairs and said ninth and tenth transistors are complementary pairs.

8. The differential amplifier of claim 7, wherein said negative supply rail is actually a ground having zero volts.

* * * * *